United States Patent
Zorgui et al.

(10) Patent No.: US 11,681,577 B2
(45) Date of Patent: Jun. 20, 2023

(54) NON-STATIONARY POLAR CODES FOR RESISTIVE MEMORIES

(71) Applicant: The Regents of the University of California, Oakland, CA (US)

(72) Inventors: Marwen Zorgui, Irvine, CA (US); Mohammed Fouda, Irvine, CA (US); Ahmed M. Eltawil, Irvine, CA (US); Zhiying Wang, Irvine, CA (US); Fadi Kurdahi, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 17/162,144

(22) Filed: Jan. 29, 2021

(65) Prior Publication Data

US 2021/0240565 A1    Aug. 5, 2021

Related U.S. Application Data

(60) Provisional application No. 62/968,260, filed on Jan. 31, 2020.

(51) Int. Cl.
*G06F 11/10* (2006.01)
*G11C 13/00* (2006.01)
*H03M 13/15* (2006.01)

(52) U.S. Cl.
CPC ...... *G06F 11/1068* (2013.01); *G11C 13/0002* (2013.01); *H03M 13/1575* (2013.01)

(58) Field of Classification Search
CPC ............ G06F 11/1012; G06F 11/1068; G11C 13/0002; G11C 13/004; H03M 13/13; (Continued)

(56) References Cited

U.S. PATENT DOCUMENTS

2015/0077277 A1* 3/2015 Alhussien ............... H03M 7/40
341/67
2015/0092886 A1* 4/2015 Ionita ................. H03M 13/2792
375/298
(Continued)

OTHER PUBLICATIONS

Niu et al., "Beyond Turbo Codes: Rate-Compatible Punctured Polar Codes," 2013 IEEE International Conference on Communications (ICC), Jun. 9-13, 2013. pp. 3423-3427.
(Continued)

*Primary Examiner* — Shelly A Chase
*Assistant Examiner* — Enamul M Kabir
(74) *Attorney, Agent, or Firm* — Thomas | Horstemeyer, LLP

(57) ABSTRACT

Disclosed are various approaches for a controller that can generate and use non-stationary polar codes for encoding and decoding information. In one example, a method includes performing, by an encoder of the controller, a linear operation on at least one vector of information to be stored in a memory. The linear operation includes generating a polar encoded representation from the at least one vector of information. The linear operation also includes generating an output using at least one permutation that is based on a statistical characterization analysis of channels of the memory and a channel dependent permutation that is applied to the polar encoded representation. In some aspects, the statistical characterization analysis includes a respective reliability level of each one of the plurality of channels, and the channel dependent permutation includes an ordered permutation that orders the channels according to their respective reliability level.

20 Claims, 10 Drawing Sheets

(58) Field of Classification Search
CPC .. H03M 13/1575; H03M 13/6362; H04L 1/00
See application file for complete search history.

(56) References Cited

U.S. PATENT DOCUMENTS

| | | | | |
|---|---|---|---|---|
| 2017/0366205 | A1* | 12/2017 | Zhang | H04L 1/0068 |
| 2018/0145702 | A1* | 5/2018 | Feygin | H01L 22/20 |
| 2018/0248655 | A1* | 8/2018 | Belfiore | H03M 13/033 |
| 2019/0165884 | A1* | 5/2019 | Koike-Akino | H04L 1/0058 |
| 2019/0296857 | A1* | 9/2019 | Gritsenko | H03M 13/3769 |

OTHER PUBLICATIONS

Arikan, Erdal, "Channel Polarization: a Method for Constructing Capacity-Acheiving Codes for Symmetric Binary-Input Miemoryless Channels," IEEE Transaction on Information Theory, vol. 55, No. 7, Jul. 2009. pp. 3051-3073.

Fouda et al., "Modeling and Analysis of Passive SwitchingCrossbar Arrays," IEEE Transactions on Circuits and Systems I: Regular Papers, vol. 65, Issue: 1, Jul. 4, 2017. pp. 270-282.

* cited by examiner

NON-STATIONARY POLAR CODES FOR RESISTIVE MEMORIES

CROSS-REFERENCE TO RELATED APPLICATION

This application claims priority to and the benefit of, U.S. Provisional Application No. 62/968,260, filed on Jan. 31, 2020, entitled "NON-STATIONARY POLAR CODES FOR RESISTIVE MEMORIES," the entire contents of which is hereby incorporated herein by reference.

BACKGROUND

Resistive memories are considered a promising memory technology enabling high storage densities with in-memory computing capabilities. However, the readout reliability of resistive memories is impaired due to the inevitable existence of wire resistance, resulting in the sneak path problem. Parallel reading of an entire crossbar row can minimize, or eliminate, the multi-path problem in single-cell reading, which is one of the causes of sneak path. But, the inevitable wire resistances can lead to undesirable voltage drops, another reason for the sneak path problem (which in some cases is referred to as the IR drop problem). In short, the need for a solution to the sneak path problem poses a critical bottleneck for adoption of resistive memories.

BRIEF DESCRIPTION OF THE DRAWINGS

Aspects of the present disclosure can be better understood with reference to the following drawings. It is noted that the elements in the drawings are not necessarily to scale, with emphasis instead being placed on clearly illustrating the principles of the embodiments. In the drawings, like reference numerals designate like or corresponding, but not necessarily the same, elements throughout the several views.

DETAILED DESCRIPTION

Figure 1:
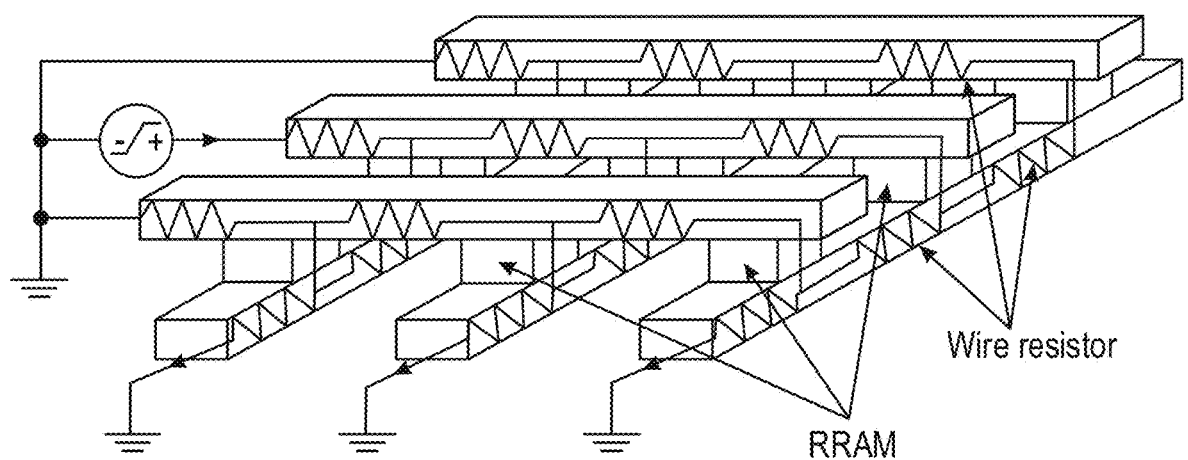
FIG. 1 illustrates an example of parallel reading of an entire row in a crossbar according to various embodiments described herein.

Resistive memories are considered a promising memory technology enabling high storage densities with in-memory computing capabilities. However, the readout reliability of resistive memories is impaired due to the inevitable existence of wire resistance, resulting in the sneak path problem. Motivated by this problem, this disclosure studies polar coding over channels with different reliability levels, termed non-stationary polar codes, and provides a technique improving its bit error rate (BER) performance. This disclosure then applies the framework of non-stationary polar codes to the crossbar array and evaluates its BER performance under three modeling approaches, namely binary symmetric channels (BSCs), binary asymmetric channels (BSCs), and asymmetric Gaussian channels. Finally, this disclosure proposes a technique for biasing the proportion of high-resistance states in the crossbar array and show its advantage in reducing further the BER. Several simulations are carried out using a SPICE-like simulator, exhibiting significant reduction in BER.

Reference will now be made in detail to the description of the embodiments as illustrated in the drawings. The words "comprising," "having," "containing," and "including," and other forms thereof, are intended to be equivalent in meaning and be open ended in that an item or items following any one of these words is not meant to be an exhaustive listing of such item or items, or meant to be limited to only the listed item or items.

It must also be noted that as used herein and in the appended claims, the singular forms "a," "an," and "the" include plural references unless the context clearly dictates otherwise. Although any systems and methods similar or equivalent to those described herein can be used in the practice or testing of embodiments of the present disclosure, the preferred, systems, and methods are now described.

Embodiments of the present disclosure will be described hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

I. Introduction

Emerging nonvolatile memories (NVMs), such as phase change memory (PCRAM), ferroelectric memory (FeRAM), spin transfer torque magnetic memory (STT-MRAM), and resistive memory (RRAM), have shown high potential as alternatives for floating-gate-based nonvolatile memories. RRAMs are considered the best candidate for the next generation nonvolatile memory due to their high reliability, fast access speed, multilevel capabilities and stack-ability creating 3D memory architectures. To achieve higher density, access devices such as transistors, diodes and selectors are removed. However, a main disadvantage of the selectorless (gate-less) crossbar-based memories is the sneak path effects which limit the readability of the array.

In resistive memories, the high/low cell resistance represents the stored bit. In order to retrieve the stored data, resistive sensing (reading) techniques are adopted. In this disclosure, a parallel reading of an entire crossbar row is adopted (see FIG. 1). FIG. 1 illustrates an example of parallel reading of an entire row in a crossbar according to various embodiments described herein. The parallel reading of an entire crossbar row can eliminate the multi-path problem in single-cell reading, one of the causes of sneak path. But, the inevitable wire resistances lead to undesirable voltage drops, another reason for the sneak path problem. These voltage drops are functions of the stored data and the wire resistance. At the expected feature size of F=5 nm of RRAMs, the wire resistance per cell can be high, e.g., 90Ω.

Figure 2A:
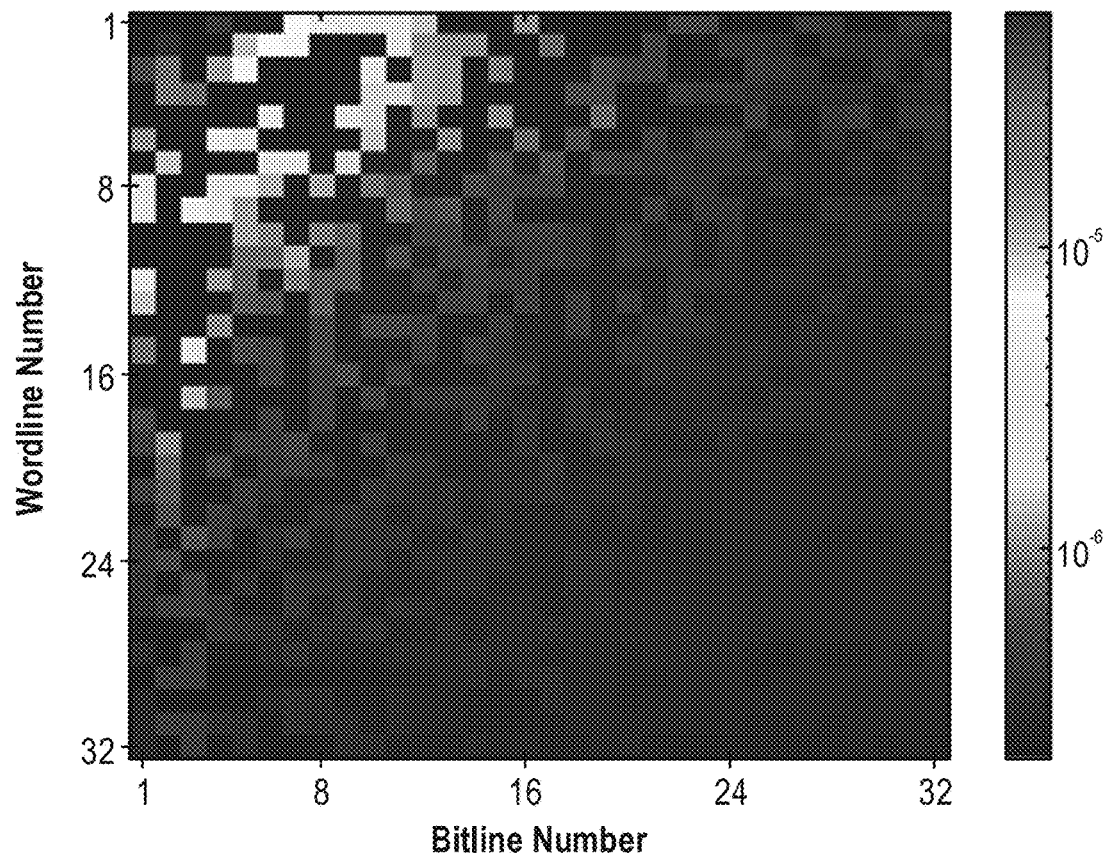
FIG. 2A illustrates an example of a measured current per cell according to various embodiments described herein.
Figure 2B:
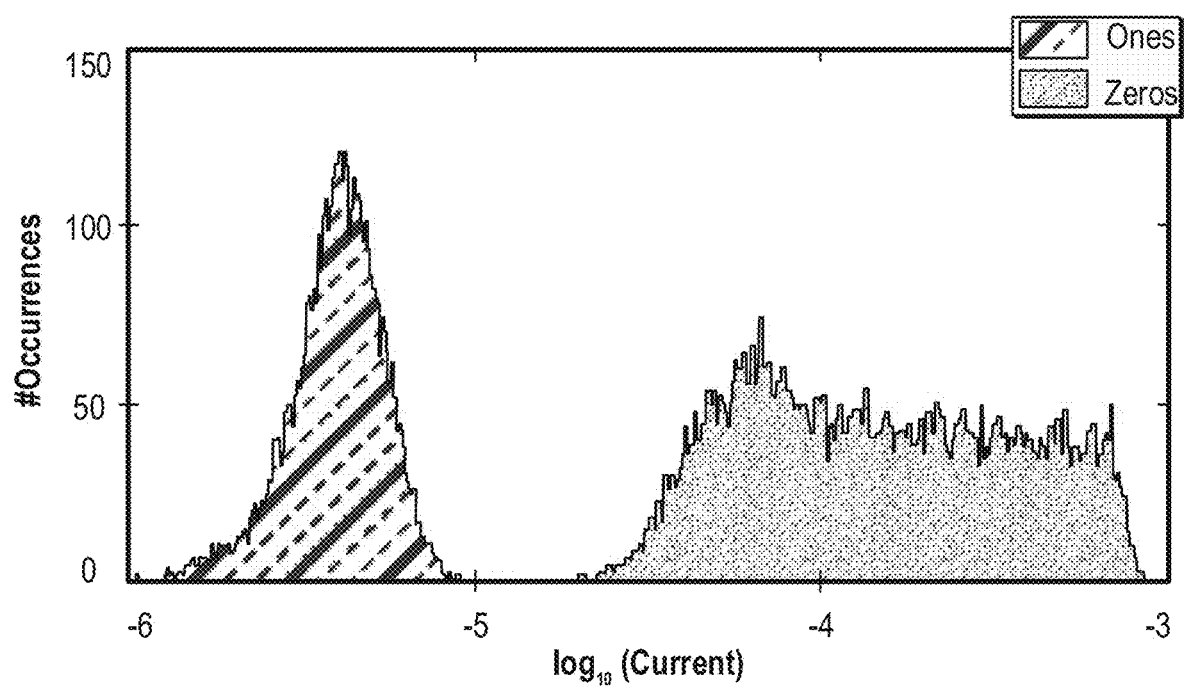
FIGS. 2B-2D illustrate an example of a histogram for bitline number (b) 1, (c) 16, and (d) 32 according to various embodiments described herein.
Figure 2C:
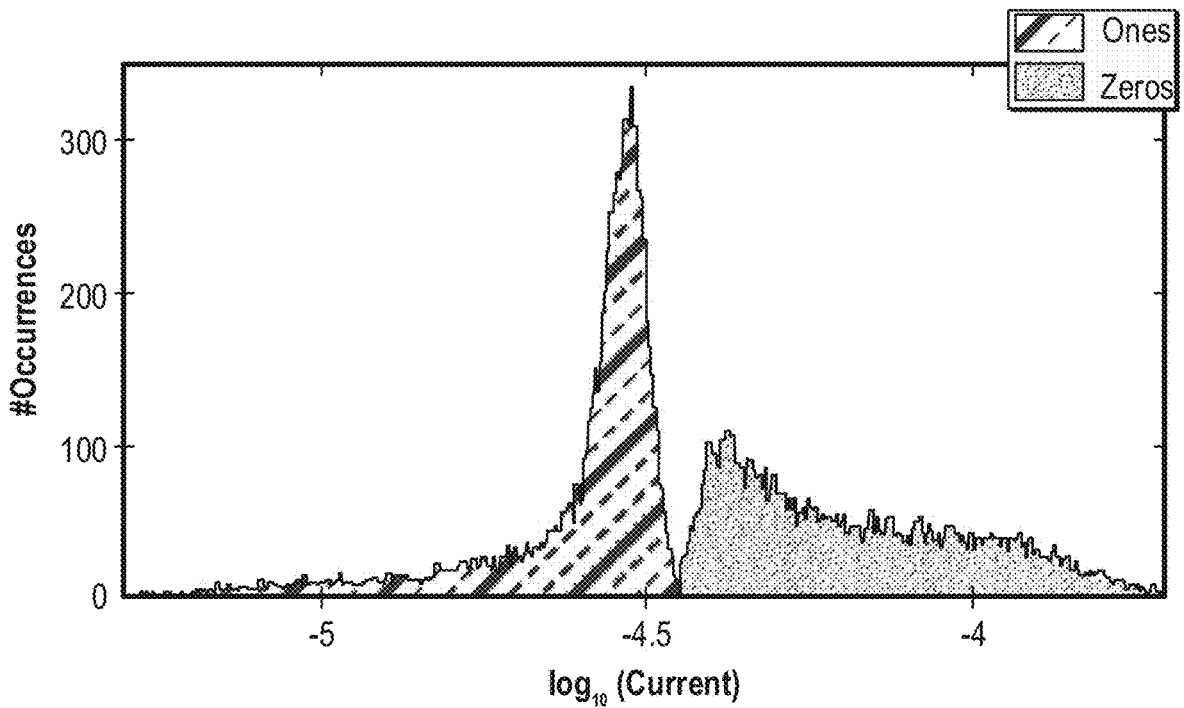
Figure 2D:
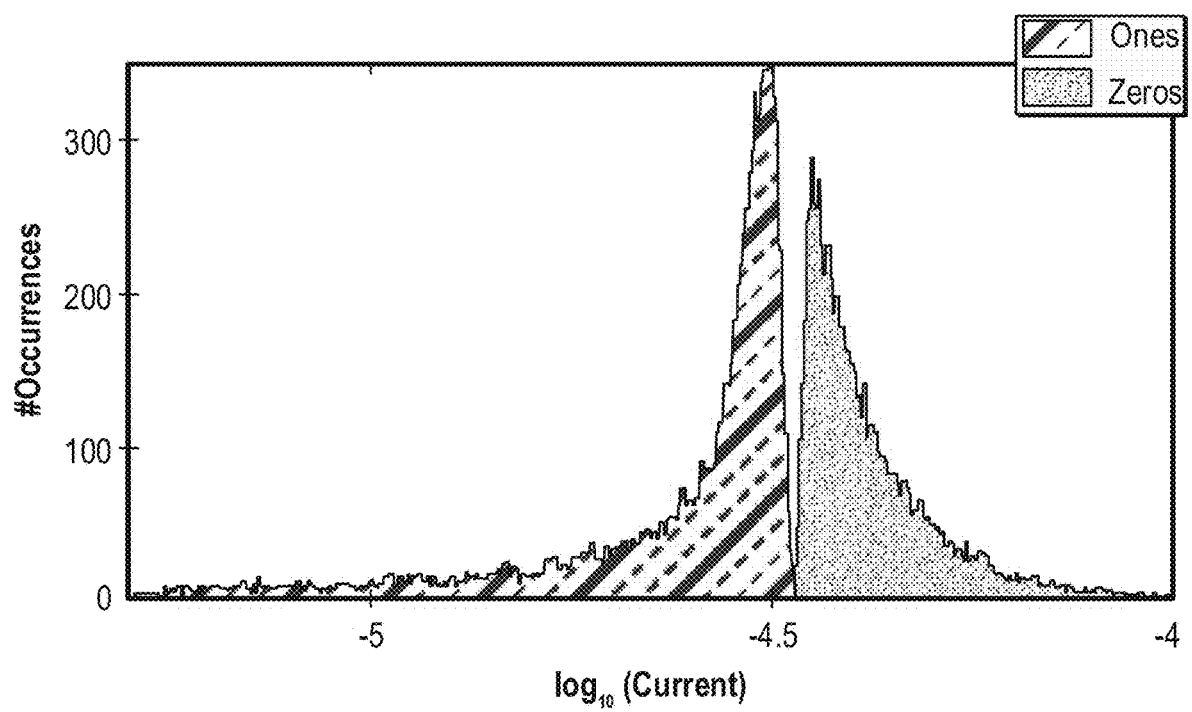

FIG. 2A illustrates an example of a measured current per cell according to various embodiments described herein. FIGS. 2B-2D illustrate an example of a histogram for bitline number (b) 1, (c) 16, and (d) 32 according to various embodiments described herein. FIG. 2A shows the measured current of each cell in a (32×32) array with 250 wire resistance, storing random data, which can be generated by a SPICE-like simulator such as the one of described by M. E. Fouda and et. al in "IEEE Trans. on Circuits and Systems I: Regular Papers, vol. 65, no. 1, pp. 270-282, 2018. Additional details are provided in the Appendix of U.S. Provisional Application No. 62/968,260 entitled "Modeling and analysis of passive switching crossbar arrays," which is hereby incorporated by reference in its entirety. Due to sneak path, the sensed current of low resistance state can decrease in both vertical and horizontal directions in the array. The top left cells have less disturbed behavior. The stored bits can be distinguishable. On the other hand, bits in the right-bottom cells can be indistinguishable due to the read margin overlap. FIG. 2B, FIG. 2C and FIG. 2D show the histogram of the measured currents of the 1st, 16th and the 32nd bitline, respectively. The larger the bitline index is, the more errors occur. Channels of the cells have varying reliability. Addressing the sneak path problem has attracted a lot of interest from both research and industry communities. Proposed solutions include hardware-based approaches, e.g., transistor gating, and/or techniques based on communication and coding theory. The focus of this disclosure is on the latter approach, with the disclosed scheme being based on polar codes. Polar codes, e.g., those proposed by E. Arikan, and other explicit error-correcting codes can achieve the capacity of binary symmetric channels, with a low-complexity encoding and successive cancellation decoding (SCD). Additional details are provided in the Appendix of U.S. Provisional Application No. 62/968,260 entitled "Channel polarization: A method for constructing capacity achieving codes for symmetric binary-input memoryless channels," which is hereby incorporated by reference in its entirety. For a code of length N, encoding/decoding can have a complexity of O(N log N). For at least the above reasons, polar codes constitute an attractive error correction scheme.

This disclosure includes structures that can utilize polar coding for channels with different reliability levels, which can be termed non-stationary polar codes. The ordering of the channels can also be utilized. This disclosure proposes an ordering with a competitive performance numerically. The framework of non-stationary polar codes can be applied to the sneak path problem and demonstrates significant improvement in terms of bit error rate (BER). Array cells can be modeled as either binary symmetric channels (BSCs) or as binary asymmetric channels (BACs) and compare their BER performances. This disclosure also includes a technique for biasing the number of high-resistance values in the crossbar through puncturing, and shows that the proposed technique can help reduce the BER in certain scenarios.

Notation: Vectors are denoted with lower-case bold letters. A permutation $\pi$ over the integers $\{0, \ldots, N-1\}$ is denoted as $\pi=[\pi(0), \ldots, \pi(N-1)]$, where $\pi(j)$ is the image of j under $\pi$. For a vector $x=[x_0, \ldots, x_{N-1}]$, $x_\pi$ denotes the vector $x_\pi=[x_{\pi(0)}, \ldots, x_{\pi(N-1)}]$.

II. Non-Stationary Polar Code Construction

For a binary input discrete memoryless channel (B-DMC), W with output alphabet $\mathcal{Y}$, denote its transition probabilities by $W(y|x)$, $x \in \{0,1\}$, $y \in \mathcal{Y}$, and define the symmetric capacity I(W) as $$I(W) \triangleq \sum_{y \in \mathcal{Y}} \sum_{x \in \{0,1\}} \frac{1}{2} W(y|x) \log \frac{W(y|x)}{W(y)}. \tag{1}$$

Arikan's polar transformation, as described in "Channel polarization: A method for constructing capacity achieving codes for symmetric binary-input memoryless channels," manufactures out of N independent copies of a given B-DMC channel, a second set of N synthesized binary-input channels. The channels can show a polarization effect, namely, as N becomes large, the symmetric capacities of the synthesized channels tend towards 0 or 1 for all but a vanishing fraction.

Figure 3:
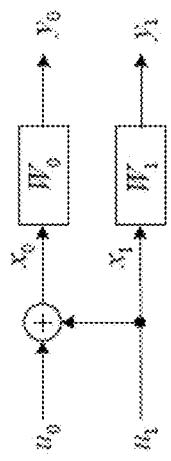
FIG. 3 illustrates an example of a basic channel polarization according to various embodiments described herein.
Figure 4:
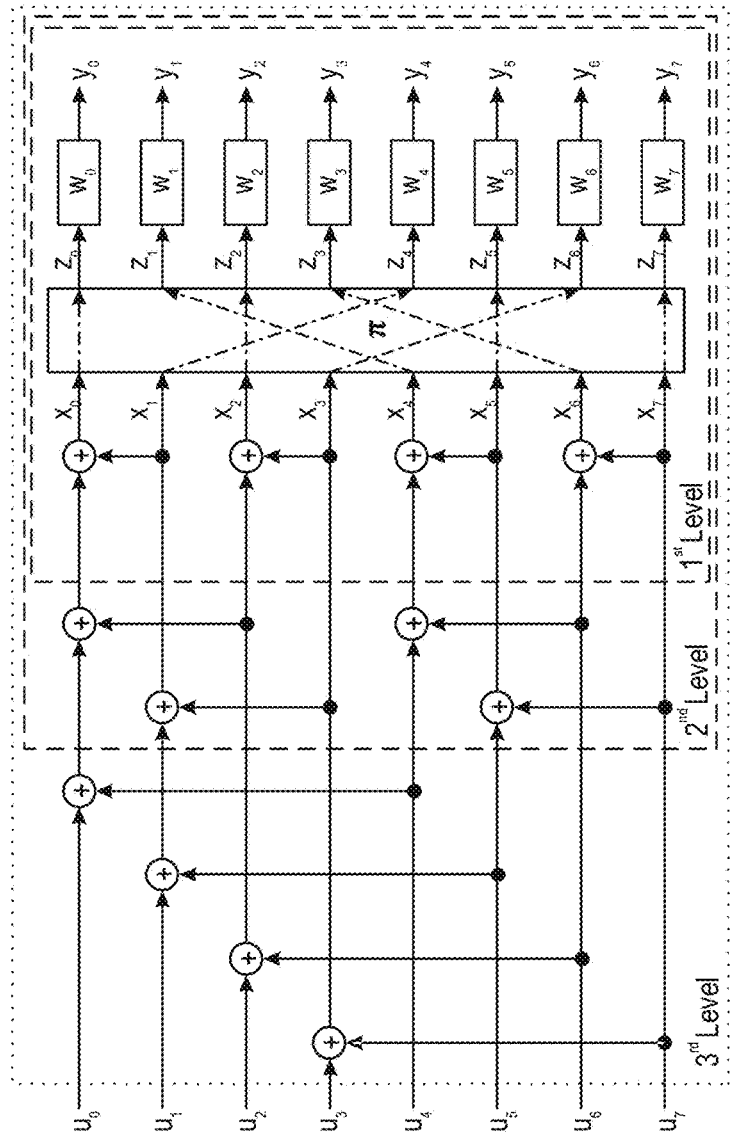
FIG. 4 illustrates an example of a polar encoding according to various embodiments described herein.

FIG. 3 illustrates an example of a basic channel polarization according to various embodiments described herein. FIG. 4 illustrates an example of a polar encoding with N=8 channels, with permutation $\pi=[0, 4, 2, 6, 1, 5, 3, 7]$ according to various embodiments described herein. The disclosed framework has access to N channels (bitlines) with varying reliabilities (see, e.g., FIG. 3 and FIG. 4), which can be viewed in contrast to the original polar codes. Such polar codes are referred to herein as non-stationary polar codes.

The basic polarization transformation, illustrated in FIG. 3, can be applied to two independent channels $W_0: \{0,1\} \to \mathcal{Y}_0$ and $W_1: \{0,1\} \to \mathcal{Y}_1$ resulting in two channels, W': $\{0,1\} \to \mathcal{Y}_0 \times \mathcal{Y}_1$ and W'': $\{0,1\} \to \mathcal{Y}_0 \times \mathcal{Y}_1 \times \{0,1\}$ given by $$W'(y_0, y_1|u_0) = \frac{1}{2} \sum_{u_1 \in \{0,1\}} W_0(y_0|u_0 \oplus u_1) W_1(y_1|u_1), \tag{2}$$

$$W''(y_0, y_1, u_0|u_1) = \frac{1}{2} W_0(y_0|u_0 \oplus u_1) W_1(y_1|u_1),$$

where $y_0 \in \mathcal{Y}_0$, $y_1 \in \mathcal{Y}_1$, and $u_0, u_1 \in \{0,1\}$. One can denote this single-step transformation by $(W_0, W_1) \mapsto (W', W'')$. The transformation preserves the average symmetric capacity, while exhibiting a polarization effect.

Lemma 1 ([9]). Suppose $(W_0, W_1) \mapsto (W', W'')$.
Then, $I(W')+I(W'')=I(W_0)+I(W_1)$, $I(W') \leq I(W_i) \leq I(W'')$, $i=0,1$. (3)

The Bhattacharya parameter of a binary discrete memoryless channel W: $\{0,1\} \to \mathcal{Y}$, denoted by Z(W) is a measure of the reliability of W, and has been used to bound the error probability of polar codes in "Channel polarization: A method for constructing capacity achieving codes for symmetric binary-input memoryless channels." The parameter $Z(W)$ is defined as $$Z(W) \triangleq \sum_{y \in \mathcal{Y}} \sqrt{W(y|0)W(y|1)}.$$

Lemma 2. Let $W_0: \{0, 1\} \to y_0$ and $W_1: \{0, 1\} \to y_1$ and $(W_0, W_1) \mapsto (W', W'')$.
(i) The following relations hold:

$$Z(W') \leq Z(W_0) + Z(W_1) - Z(W_0)Z(W_1), \quad (4)$$

$$Z(W'') = Z(W_0)Z(W_1), \quad (5)$$

$$Z(W') \geq \sqrt{Z(W_0)^2 + Z(W_1)^2 - Z(W_0)^2 Z(W_1)^2}. \quad (6)$$

(ii) Equality (4) holds with equality if $W_0$ or $W_1$ is a binary erasure channel.
(iii) Equality (6) holds with equality if both $W_0$ and $W_1$ are binary symmetric channels.

Lemma 2 can indicate that reliability improves under a single-step channel transformation in the sense that $$Z(W') + Z(W'') \leq Z(W_0) + Z(W_1),$$

with equality if $W_0$ or $W_1$ is a binary erasure channel (BEC).

The single-step transformation, as described in (2), can be generalized to the case of $N=2^n$ binary, memory-less, but not necessarily stationary channels $\{W_i\}_{i=0}^{N-1}$. In particular, let $W_{m,i}$ denote the i-th bit channel after m levels of polarization of the sequence $\{W_i\}_{i=0}^{N-1}$, where $W_{0,i} \triangleq W_i$, $i=0, \ldots, N-1$. Applying Arikan's polar construction results in a collection of synthesized channels, such that, for any level $1 \leq l \leq n$ for $0 \leq j < 2^{l-1}$, $0 \leq m < 2^{n-l}$, we have $$(W_{l-1,2^l m+j}, W_{l-1,2^l m+2^{l-1}+j}) \mapsto (W_{l,2^l m+j}, W_{l,2^l m+2^{l-1}+j}). \quad (7)$$

The fraction of non-polarized channels can approach 0, e.g., for every $0 < \alpha < b < 1$, $$\lim_{N \to \infty} \inf \frac{1}{N} \left| 0 \leq i < N : I(W_{n,i}) \in [a, b] \right| = 0.$$

In the asymptotic regime where the blocklength N is large, the effective average symmetric capacity $$\bar{I}(\{W_i\}_{i=0}^{\infty}) \triangleq \lim_{N \to \infty} \frac{1}{N} \sum_{i=1}^{N} I(W_i)$$

is achievable. Moreover, the polar coding scheme can be constructed based on Arikan's channel polarization transformation in combination with certain permutations at each polarization level. The present disclosure describes the performance of non-stationary polar codes in the finite blocklength regime.

A. Polar Code Encoding and Decoding

Let $u=[u_0, u_1, \ldots, u_{N-1}]$ and $x=[x_0, x_1, \ldots, x_{N-1}]$ be the input and the output of a length-N polar code, respectively, with $N=2^n$ for some integer n. The polar transformation is given by $$x = uG, \quad G = \begin{bmatrix} 1 & 0 \\ 1 & 1 \end{bmatrix}^{\otimes n},$$

where the symbol $[\cdot]^{\otimes n}$ denotes the n-th Kronecker power operator. When $n=1, N=2$, the basic polarization transformation is applied to two independent channels $W_0: \{0,1\} \to \mathcal{Y}_0$ and $W_1: \{0,1\} \to \mathcal{Y}_1$, resulting in two channels, $W': \{0,1\} \to \mathcal{Y}_0 \times \mathcal{Y}_1$ and $W'': \{0,1\} \to \mathcal{Y}_0 \times \mathcal{Y}_1 \times \{0,1\}$ given by $$W'(y_0, y_1|u_0) = \frac{1}{2} \sum_{u_1 \in \{0,1\}} W_0(y_0|u_0 \oplus u_1) W_1(y_1|u_1),$$

$$W''(y_0, y_1, u_0|u_1) = \frac{1}{2} W_0(y_0|u_0 \oplus u_1) W_1(y_1|u_1),$$

where $y_0 \in \mathcal{Y}_0$, $y_1 \in \mathcal{Y}_1$, and $u_0, u_1 \in \{0,1\}$. One can denote this single-step transformation by $(W_0, W_1) \mapsto (W', W'')$. After polar encoding, one obtains N synthesized channels $\{W^{(i)} \triangleq W_{n,i}, 0 \leq i \leq N-1\}$. A polar code of dimension k transmits k information bits in the k synthesized channels with the highest $I(W^{(i)})$ (denote the corresponding information set by $\mathcal{I}$ or I), and N–k arbitrary but fixed bits in the remaining N–k synthesized channels (denoted by $\mathcal{F}$). Decoding of polar codes is carried out using successive cancellation decoding (SCD) as in "Channel polarization: A method for constructing capacity achieving codes for symmetric binary-input memoryless channels," taking into account the appropriate likelihood ratios of the original channels.

Remark 1. The information set of a non-stationary polar code can be determined as long as $I(W^{(i)})$ are computed. However, their computational complexities can be difficult to manage. The reliability parameters of the synthesized channels can be approximated efficiently by $Z(W^{(i)})$ using (4) and (5) in Lemma 2. Call this method the Bhattacharyya bound approach. Let $Z_{n,i}$ denote the Bhattacharyya parameter of channel $W_{n,i}$. Then, apply the following recursion: for level $1 \leq l \leq n$, for $0 \leq j \leq 2^{l-1}$ and $0 \leq m \leq 2^{n-l}$, one has $$Z_{l,2^l m+j} = Z_{l-1,2^l m+j} + Z_{l-1,2^l m+2^{l-1}+j} - Z_{l-1,2^l m+j} Z_{l-1,2^l m+2^{l-1}+j},$$
$$Z_{l,2^l m+2^{l-1}+j} = Z_{l-1,2^l m+j} Z_{l-1,2^l m+2^{l-1}+j},$$

where $\{Z_{0,i}, 0 \leq i < N\}$ are the initial channel Bhattacharyya parameters. The indices of the lowest N–k values in the set of N final stage values form the set F. This algorithm is an evolution of the Bhattacharyya parameters of channels from right to left (see FIG. 4), preferably applied in log-domain to avoid underflow. FIG. 4 shows an example of applying a multi-level polarization process.

B. Role of the Channel Ordering

The performance of polar codes can depend on the synthesized channels of the information set $\Sigma_{i \in \mathcal{I}} I(W^{(i)})$, described e.g., in "Channel polarization: A method for constructing capacity achieving codes for symmetric binary-input memoryless channels." As illustrated in FIG. 4, to construct a non-stationary polar code, one can apply a permutation $\pi$ to the vector x in order to enhance the overall performance. In some examples, one wants to find a permutation $\pi$ such that for all permutation $\tilde{\pi}$ $$\sum_{i \in I_{\pi^*}} I(W_{\pi^*}^{(i)}) \geq \sum_{i \in I_{\tilde{\pi}}} I(W_{\tilde{\pi}}^{(i)}), \quad (8)$$

where $I(W_\pi^{(i)})$ is the symmetric capacity of the i-th synthesized channel under permutation $\pi$ and $\mathcal{I}_\pi$, its information set.

Remark 2. The permutation $\pi$ can be defined such that $z_\pi = x$, or equivalently $z = x_{\pi^{-1}}$. Then, $Z_{\pi(i)} = x_i$, implying that symbol $x_i$ goes through channel $W_{\pi(i)}$, for $0 \le i < N$. Correspondingly, a reverse permutation can be utilized for the output of the channels.

Figure 5:
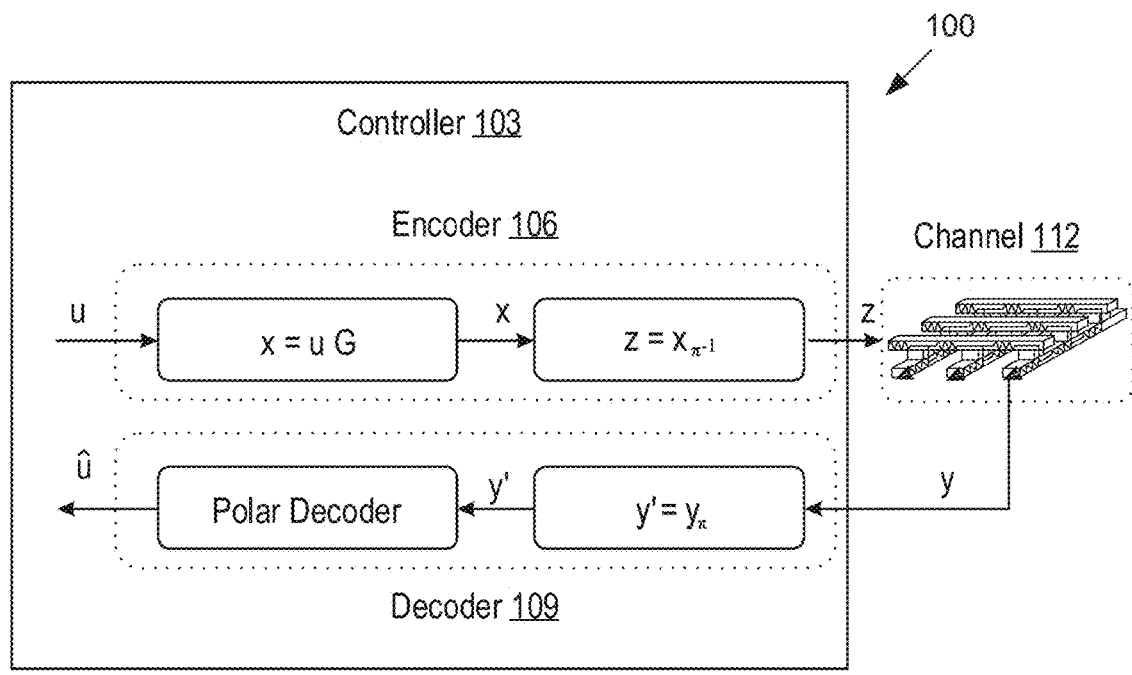
FIG. 5 illustrates an example of a system model according to various embodiments described herein.

FIG. 5 illustrates an example of a system 100 including a controller 103 with an encoder 106 and a decoder 109. The controller 103 can obtain a statistical characterization analysis that ranks a plurality of channels of a nonvolatile memory based at least in part on reliabilities associated with memory cells of the nonvolatile memory. The controller 103 can obtain information, e.g., u, to be stored in the nonvolatile memory. The controller 103 can encode the information to be stored using a linear operation on at least one vector of the information to be stored.

In some examples, a method includes the encoder 106 performing the linear operation, comprising: generating a polar encoded representation, e.g., x, comprising a length-N polar code from the at least one vector of the information to be stored; and generating an output, e.g., z, using at least one permutation that is based at least in part on the statistical characterization analysis and applying a channel dependent permutation to the polar encoded representation. The controller 103 can be configured to cause the output, e.g., z, to be stored in the nonvolatile memory.

The controller 103 can receive stored information, e.g., y, stored in a nonvolatile memory. The decoder 109 can generate a second polar encoded representation, e.g., the vector $y' = [y_{\pi(0)}, \ldots, y_{\pi(N-1)}] = y_\pi$, by undoing one or more permutation(s). The decoder 109 can include a polar decoder that can generate a polar decoded representation, e.g., $\hat{u}$, by performing polar decoding on the second polar encoded representation. As shown in FIG. 5, system 100 can include the controller 103 and a memory or channel 112. According to some examples, controller 103 may receive and/or fulfill read/write requests for the memory or the channel 112 via a communication link (not depicted). The communication link may communicatively couple controller 103 to elements or features associated with an operating system for a computing device. For these examples, the system 100 may be a memory device for the computing device. As a memory device, system 100 may serve as a memory device with high storage densities and in-memory computing capabilities for the computing device.

Remark 3. In general, the channel symmetric capacities can be given in any arbitrary order. In this case, in order to study the effect of permutations in a canonical way, one can apply the composition permutation $\pi_{ord} \circ \pi$ to the output x, where $\pi_{ord}$ is a permutation that orders the channels in increasing order of symmetric capacities: that is $I(W_{\pi_{ord}(i)}) \le I(W_{\pi_{ord}(j)})$, for $i < j$. Thus, the output of the polar encoder $x_i$ is mapped to channel $W_{\pi_{ord} \circ \pi(i)}$, i.e., $x_i = z_{\pi_{ord} \circ \pi(i)}$.

Next, it is shown that some channel orderings are equivalent after polarization.

Definition 3. Given N B-DMC $\{W_i\}_{i=0}^{N-1}$, an equivalence class of permutations over $\{0, \ldots, N-1\}$ can include all channel permutations it such that the n-level polarization process of the channels $\{W_{\pi(i)}\}_{i=0}^{N-1}$ results in the same symmetric capacities.

Lemma 4. The number of permutation classes is at most $$\frac{N!}{2^{N-1}}.$$

Proof: Consider the two single-step transformations $(W_0, W_1) \mapsto (W'_1, W''_1)$ and $(W_1, W_0) \mapsto (W'_2, W''_2)$. From (1) and (2), one has $$I(W''_1) = \sum_{y_0, y_1, u_0} \sum_{u_1} \frac{1}{4} W_0(y_0 | u_0 \oplus u_1) \quad (9)$$

$$W_1(y_1 | u_1) \times \log \frac{\frac{1}{2} W_0(y_0 | u_0 \oplus u_1) W_1(y_1 | u_1)}{W''_1(y_0, y_1, u_0)} = \sum_{y_0, y_1, u_0} \sum_{u_1} \frac{1}{2}$$

$$W_0(y_0 | u_1) W_1(y_1 | u_0 \oplus u_1) \times \log \frac{W_0(y_0 | u_1) W_1(y_1 | u_0 \oplus u_1)}{W''_1(y_0, y_1, u_0)},$$

where the second equality is obtained by a change of variable. On the other hand, $$W''_1(y_0, y_1, u_0) = \sum_{u_1 \in \{0,1\}} W_0(y_0 | u_0 \oplus u_1) W_1(y_1 | u_1) \quad (10)$$

$$= \sum_{u_1 \in \{0,1\}} W_0(y_0 | u_1) W_1(y | u_0 \oplus u_1)$$

$$= W''_2(y_0, y_1, u_0).$$

From (9) and (10), obtain $I(W''_1) = I(W''_2)$. From (3), it follows $I(W'_1) = I(W'_2)$. Thus, the single-step transformation is symmetric in the sense that exchanging the order of $W_0$ and $W_1$ does not impact the symmetric capacities of the synthesized channels. It follows that for $N = 2^n$ channels, permuting channel $W_{2i}$ and channel $W_{2i+1}$, for $$0 \le i \le \frac{N}{2} - 1$$

does not change the symmetric capacities of the synthesized channels obtained at the end of the polarization process. Extending the above reasoning to level 2, permuting $$(W_{4i}, W_{4i+1}) \text{ with } (W_{4i+2}, W_{4i+3}), 0 \le i \le \frac{N}{4} - 1$$

results in the same symmetric capacities of the synthesized bit channels. At level 3, one can permute $$(W_{8i}, W_{8i+1}, W_{8i+2}, W_{8i+3}) \text{ with } (W_{8i+4}, W_{8i+5}, W_{8i+6}, W_{8i+7}),$$

$$0 \le i \le \frac{N}{8} - 1$$

without changing the symmetric capacities. Similar observation applies to all polarization levels l, for $1 \le l \le n$. Thus, the number of permutation classes is upper bounded by $$\frac{N!}{2^{1+2+\ldots+\frac{N}{2}}} = \frac{N!}{2^{1+2+\ldots+2^{n-1}}} = \frac{N!}{2^{2^n - 1}} = \frac{N!}{2^{N-1}}.$$

Remark 4. Equivalent classes of permutations can be equally defined in terms of the Battacharaya parameters instead of symmetric capacities, and the statement of Lemma 4 holds.

Figure 6:
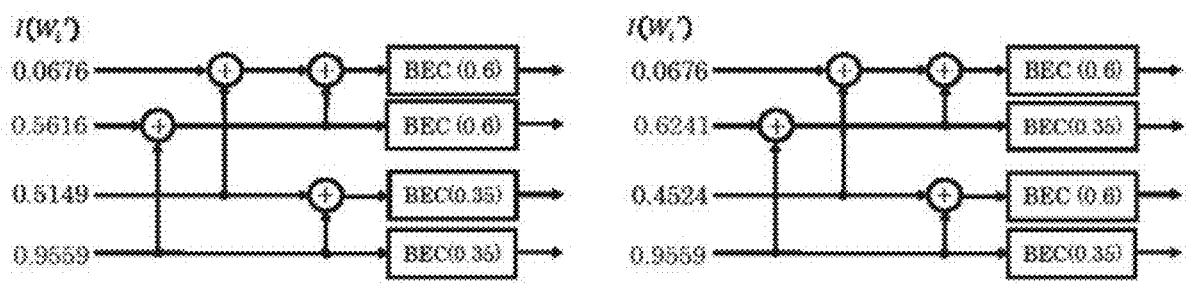
FIG. 6 illustrates examples of orderings of the four binary erasure channel (BEC) BECs, with synthetic channel rates according to various embodiments described herein.

Example 1. FIG. 6 illustrates the polarization process for N=4 channels consisting of two different binary erasures channels (BECs). Based on Lemma 4, it can be checked that in this example, the number of permutation classes is 2, as shown in FIG. 6. For a target rate of ½, the rightmost permutation in FIG. 6 is advantageous as it corresponds to the highest sumrate of the two best synthetic channels. As depicted, FIG. 6 illustrates two different ordering of the four BECs, with their synthetic channel rates. The permutation on the left is $\pi=[0,1,2,3]$ and the permutation on the right is $\pi=[0,2,1,3]$.

Example 1 shows that in the finite blocklength regime, the ordering of the channels matters, depending on the code rate. For N=4 BECs with different erasure probabilities, Proposition 1 determines the best ordering depending on the target rate.

Proposition 1. Consider N=4 BECs with parameters such that $\epsilon_i$, $1 \leq i \leq 4$. Then, the permutation $\pi_{ord} \circ \pi$, where $\pi=[0,3,1,2]$ satisfies (8).

Extending the analysis in Proposition 1 is not tractable. This disclosure considers the bit-reversal permutation defined below and explores the performance under bit-reversal permutation through various numerical examples.

Definition 5. Define $\psi$ to be the bit-reversal permutation. For each integer $i \in \{0, \ldots, 2^n-1\}$, $\psi(i)$ is the integer obtained by reversing the binary representation of i. That is, let $$i = \sum_{j=1}^{n} b_j 2^{j-1}, \text{ then } \psi(i) = \sum_{j=1}^{n} b_j 2^{n-j}.$$

As an example, when N=8, $\psi=[0,4,2,6,1,5,3,7]$, as illustrated in FIG. 4.

From the proof of Proposition 1 and Lemma 4, when $\epsilon_0=\epsilon_1$, or $\epsilon_2=\epsilon_3$, then $\psi$ satisfies (8) and is optimal, which coincides with Example 1.

Figure 7:
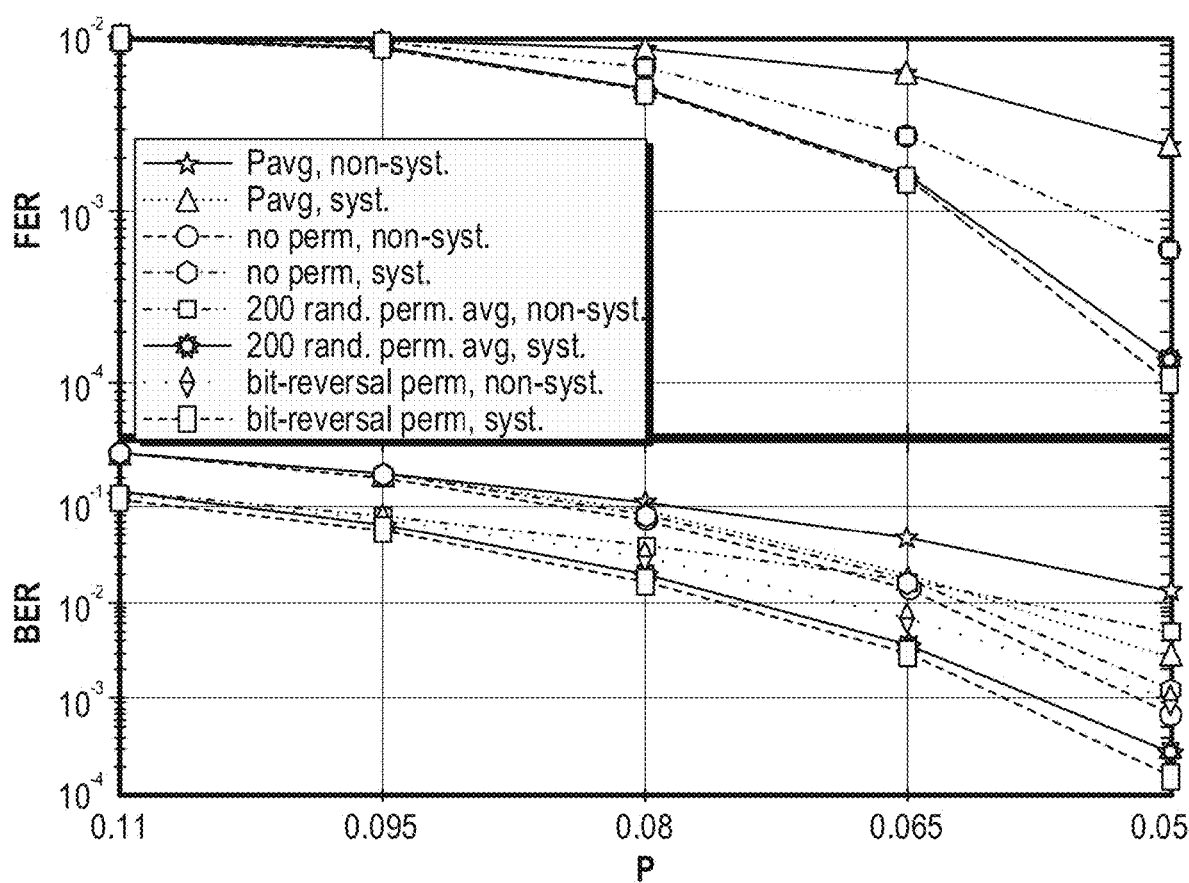
FIG. 7 illustrates an example of performance evaluation for binary symmetric channels (BSCs) with linearly spaced cross-over probabilities according to various embodiments described herein.

Example 2. Consider N binary symmetric channels (BSCs) with varying cross-over probabilities, linearly spaced and centered at value $p \in \{0.05, 0.065, 0.08, 0.095, 0.11\}$, with maximum deviation of 0:045. A rate ½ and a block size $N=2^{10}$ can be considered. The performance of a regular polar code designed for the average BSC channel can be evaluated, with $p_{avg}$ satisfying $$N(1 - h(p_{avg})) = \sum_{i=0}^{N-1} (1 - h(p_i)),$$

where $h(\cdot)$ is the binary entropy function and $p_i$'s are the cross-over probabilities of the channels. The default ordering of the channels is such that the channels' Bhattacharya parameters are ordered in a descending order (e.g., decreasing order of $p_i$'s). This disclosure evaluates the performance with the default ordering (no permutation) and the performance with the bit-reversal permutation. This disclosure also evaluates the performance obtained by averaging 200 random permutations. For each scenario, the frame error rate (FER) and the bit error rate (BER) with non-systematic encoding and systematic encoding, for $10^4$ runs, is evaluated. FIG. 7 illustrates the results of a performance evaluation for BSCs with linearly spaced cross-over probabilities, N=1024, k=512. Systematic encoding of non-stationary polar codes enhances the BER performance compared to non-systematic encoding, while keeping the FER unchanged. The regular polar code with $p_{avg}$ exhibits the worst BER, while the non-stationary polar code under systematic encoding with $\pi=\psi$ performs the best. In particular, the latter scenario outperforms all 200 random permutations for all values of p.

Based on the observation that bit-reversal permutation achieves competitive BER numerically, one can choose to apply $\pi=\psi$ for the disclosed non-stationary polar codes, so as to mitigate the sneak path problem in crossbar arrays.

III. Application to Resistive Crossbar Arrays

A. General Framework

As outlined in the introduction, the memory cells (e.g., crossbar array cells) can exhibit different reliability levels. For this reason, this disclosure proposes the application of non-stationary polar codes to address the problem. A two-step approach can be applied:
1) First estimate a single detection threshold for each wordline (row) to minimize the overall uncoded BER per word. This transforms the read channels into BSCs. The threshold for each wordline is estimated by generating large training data and then applying a good binary classifier. For instance, it is observed that a logistic regression-based classifier gives superior performance in terms of accuracy and speed.
2) Based on the estimated thresholds in step 1), estimate the cross-over probabilities of each cell in the array. Non-stationary polar codes can then be applied using the cell characterizations.

Each row can be encoded separately. The present disclosure focuses primarily on encoding the entire array. This can be suitable for applications such as archival data and image storage. Assuming the crossbar array size is $(N_1 \times N_2)$, then, the blocklength is $N=N_1 N_2$. The encoded output symbol $z_{in+j}$, $0 \leq i<m$, $0 \leq j<n$, is stored at the (i, j)-th entry in the crossbar array (e.g., vectorize the array row by row). The disclosed approach can use a SPICE-like simulator that is built based on modeling of the resistive crossbar array from M. E. Fouda et. al in "Modeling and analysis of passive switching crossbar arrays." This numerical simulator offers a fast alternative to SPICE simulators while maintaining the same simulation accuracy. In simulations, the high resistance state, representing 1, and the low resistance state, representing 0, can be set to 1 MΩ and 1 kΩ, respectively.

Figure 8:
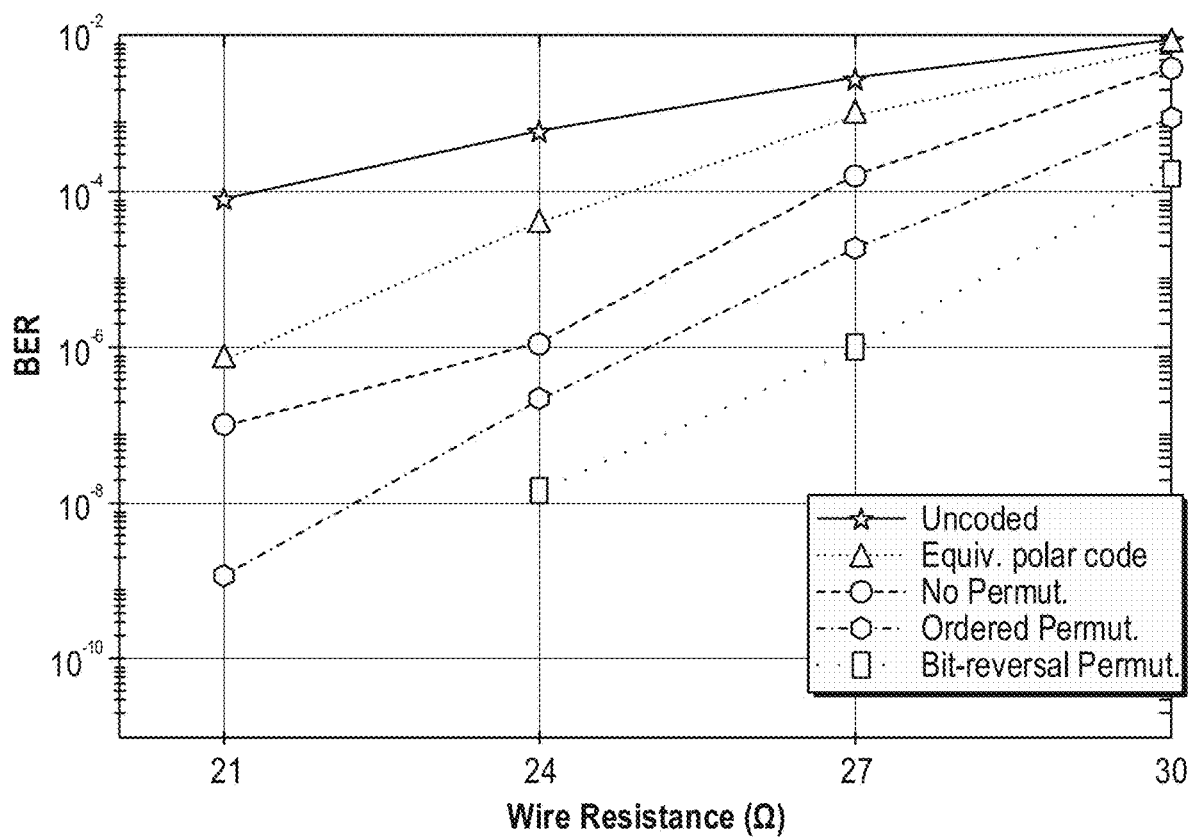
FIG. 8 illustrates an example of performance evaluation for a crossbar array according to various embodiments described herein.

Example 3. FIG. 8 illustrates a performance evaluation for a (32×32) crossbar array, code rate 0.8. In FIG. 8, the BER performance of systematic polar codes is simulated for four cases: (i) equivalent regular polar codes correspond to BSCs with parameter $p_{avg}$, similar to Example 2, (ii) no permutation, (iii) permutation $\pi_{ord}$, and (iv) permutation $\pi=\pi_{ord} \circ \psi$, where $\pi_{ord}$ is as defined in Remark 3. Clearly, the BER permutation under $\pi=\pi_{ord} \circ \psi$ outperforms the other permutations.

B. Binary Asymmetric Channel Modeling

The array cells can be modeled as BSCs. Analyzing further the uncoded error distribution, as one may infer from FIGS. 2B, 2C, and 2D, the conditional error distributions under 0's and 1's are different, e.g., P(error|0)≠P(error|1). Taking this observation into consideration, one can model the crossbar array cells as binary asymmetric channels (BACs) and apply the non-stationary polar codes developed herein.

Figure 9:
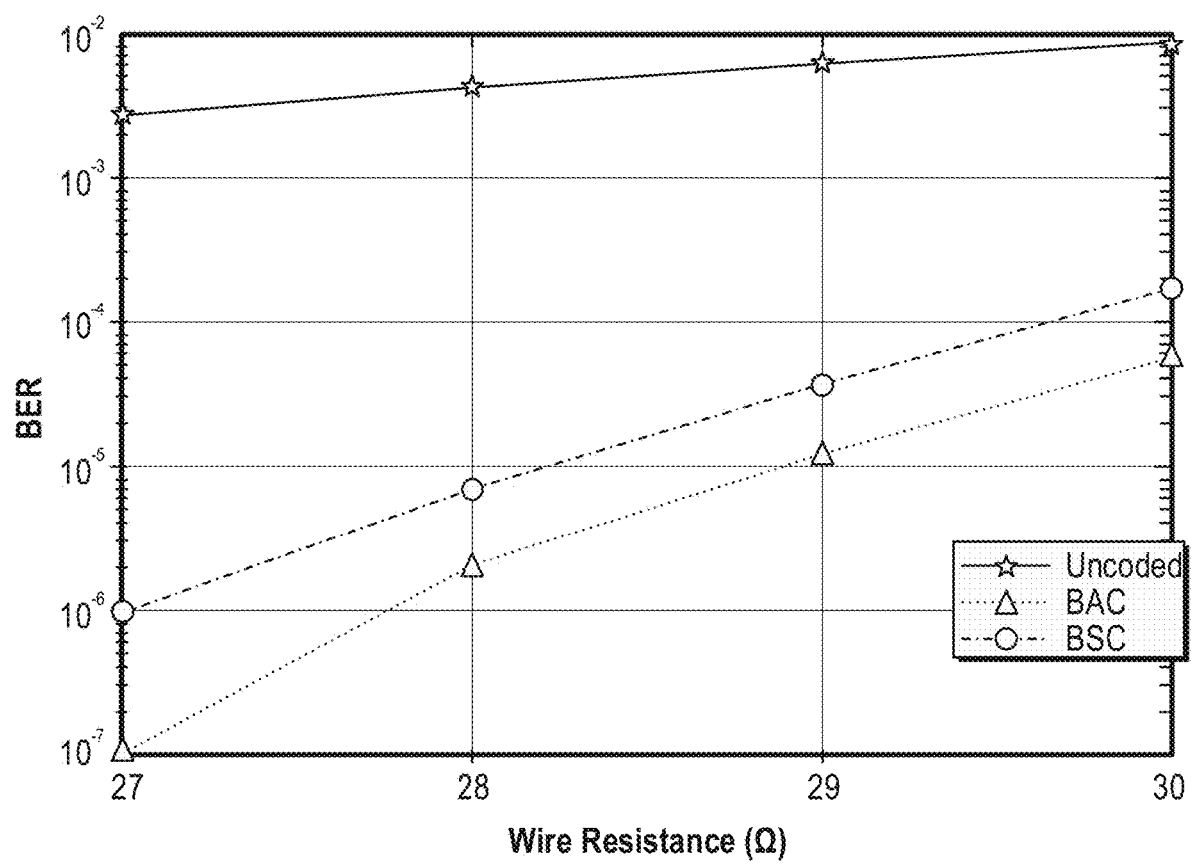
FIG. 9 illustrates an example of bit error rate (BER) performance under BSC and binary asymmetric channel (BAC) modeling according to various embodiments described herein.

Example 4. FIG. 9 illustrates a BER performance under BSC and BAC modeling for a (32×32) crossbar array, code rate 0.8. In FIG. 9, one can compare the systematic BER performance under both BSC and BAC modeling. As expected, the BER performance under the more accurate BAC model is higher, and the gain increases as the wire resistance decreases.

C. Punctured Polar Codes

Techniques described herein can enhance the BER performance in some scenarios. The sneak paths exist through the cells having low resistances, causing inter-cell interference. Having more high resistances in the array can help mitigate the sneak path problem. To leverage this intuition, one can investigate the use of a (punctured) polar code of a shorter length, say $N-N_p$, while storing high resistances in the corresponding punctured $N_p$ cells in the array. Clearly, there is a trade-off between two opposite factors: puncturing reduces the number of redundant codeword symbols, hence degrading the performance of polar codes, while high resistances decrease the sneak path effect resulting in fewer read errors. The following investigates the application of the above approach to the crossbar array.

A punctured polar code can be obtained from the N-length parent polar code using a binary puncturing vector $w=[w_0, w_1, \ldots, w_{N-1}]$, where the zeros imply the punctured positions. One can note that the information set $\mathcal{I}$ should be recomputed as in Remark 1, when considering puncturing. Punctured polar codes have been investigated by many works, and several efficient puncturing patterns have been proposed in the literature, for example by K. Niu, K. Chen, and J.-R. Lin in "Beyond turbo codes: Rate-compatible punctured polar codes," in IEEE Int. Conf. on Communications (ICC). IEEE, 2013, pp. 3423-3427. Additional details are provided in the Appendix of U.S. Provisional Application No. 62/968,260 entitled "Beyond turbo codes: Rate-compatible punctured polar codes," which is hereby incorporated by reference in its entirety.

An empirically good puncturing algorithm, termed quasi-uniform puncturing (QUP), polar codes can outperform the performance of turbo codes in WCDMA (Wideband Code Division Multiple Access) or LTE (Long Term Evolution) wireless communication systems in the large range of code lengths. According to some examples herein, QUP can be adopted as a puncturing pattern.

Definition 6. The QUP is described as follows:
1) Initialize the vector w as all ones, and then set the first $N_p$ bits of w to zeros;
2) Perform bit-reversal permutation on the vector w and obtain the puncturing pattern.

Example 5. Let N=8, $N_p$=3. The initial puncturing vector is w=[0, 0, 0, 1, 1, 1, 1, 1]. After bit-reversal permutation, the puncturing vector becomes w=[0, 1, 0, 1, 0, 1, 1, 1].

By employing QUP in conjunction with the permutation $\pi_{ord} \circ \psi$, puncturing $N_p$ positions corresponds to not using the $N_p$ cells with the worst reliability levels for data storage. By placing high-resistance values (e.g., 1's) in the punctured locations, one can increase the frequency of 1's in the codeword by $$\frac{N_p}{2N}.$$

Lemma 7. For a punctured polar code length of $N-N_p$, the frequency of 1's in the array is given by $$\frac{1}{2} + \frac{N_p}{2N}.$$

Proof: Let i be chosen uniformly at random in $\{0, \ldots, N-1\}$, and let $z_i$ be the corresponding codeword symbol. Let $\mathcal{B}_p$ be the set of punctured locations. The size of $\mathcal{B}_p$ is $N-N_p$. Then, one can write $$P(z_i = 1) = P(i \in \mathcal{B}_p)P(z_i = 1 | i \in \mathcal{B}_p) +$$
$$P(i \notin \mathcal{B}_p)P(z_i = 1 | i \notin \mathcal{B}_p)$$
$$= \frac{N_p}{N} + \frac{1}{2}\frac{N-N_p}{N} = \frac{1}{2} + \frac{N_p}{2N}.$$

Figure 10:
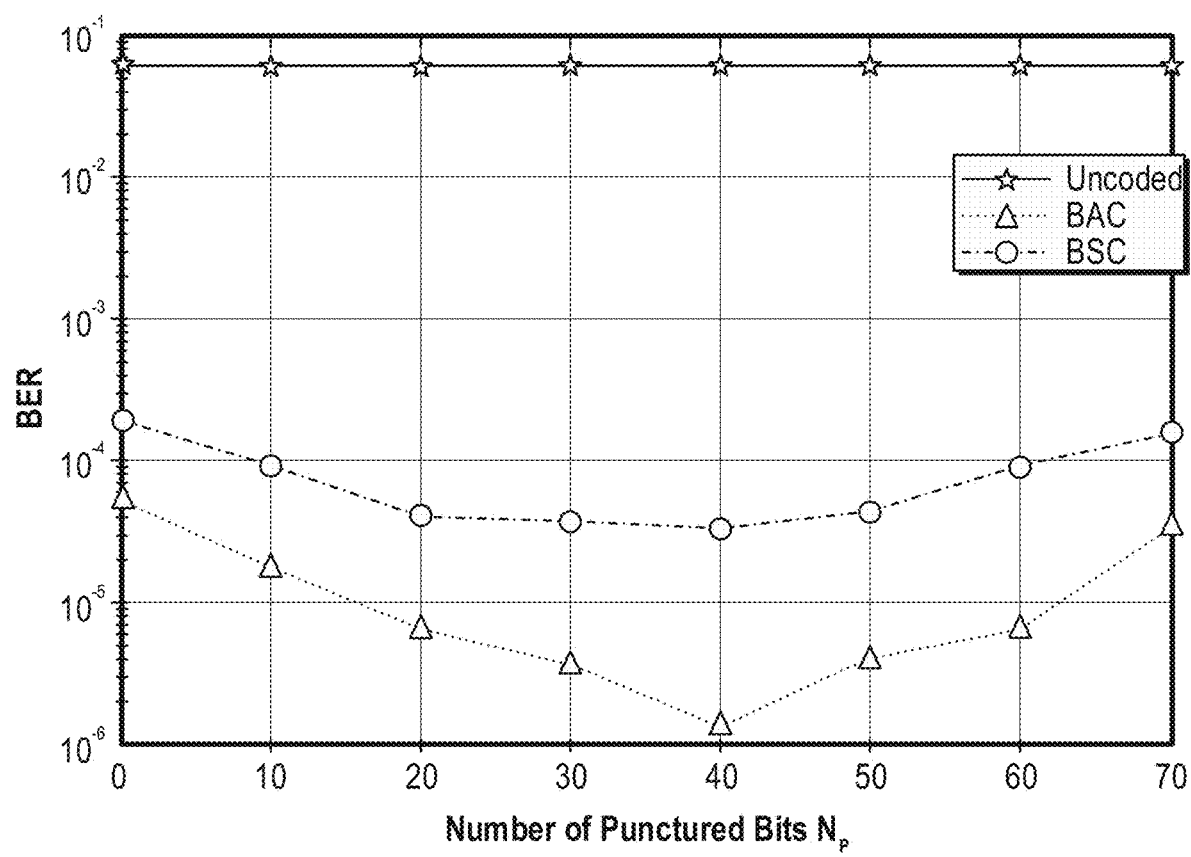
FIG. 10 illustrates an example of performance evaluation for punctured polar encoding according to various embodiments described herein.

Example 6. FIG. 10 illustrates performance evaluation of punctured polar encoding over the (32×32) crossbar array for code rate 0.8. FIG. 10 illustrates the systematic BER performance of QUP for a (32×32) array with 35Ω wire resistance, $\pi = \pi_{ord} \circ \psi$. One can observe that the BER decreases as more bits ($N_p$) are punctured and as the frequency of increases. This gain is reversed for $N_p > 40$ and the BER increases as $N_p$ and the codeword redundancy decrease. The BER is improved by a factor of 5.7 for a symmetric channel model and by a factor of 38.5 for an asymmetric channel model.

Figure 11:
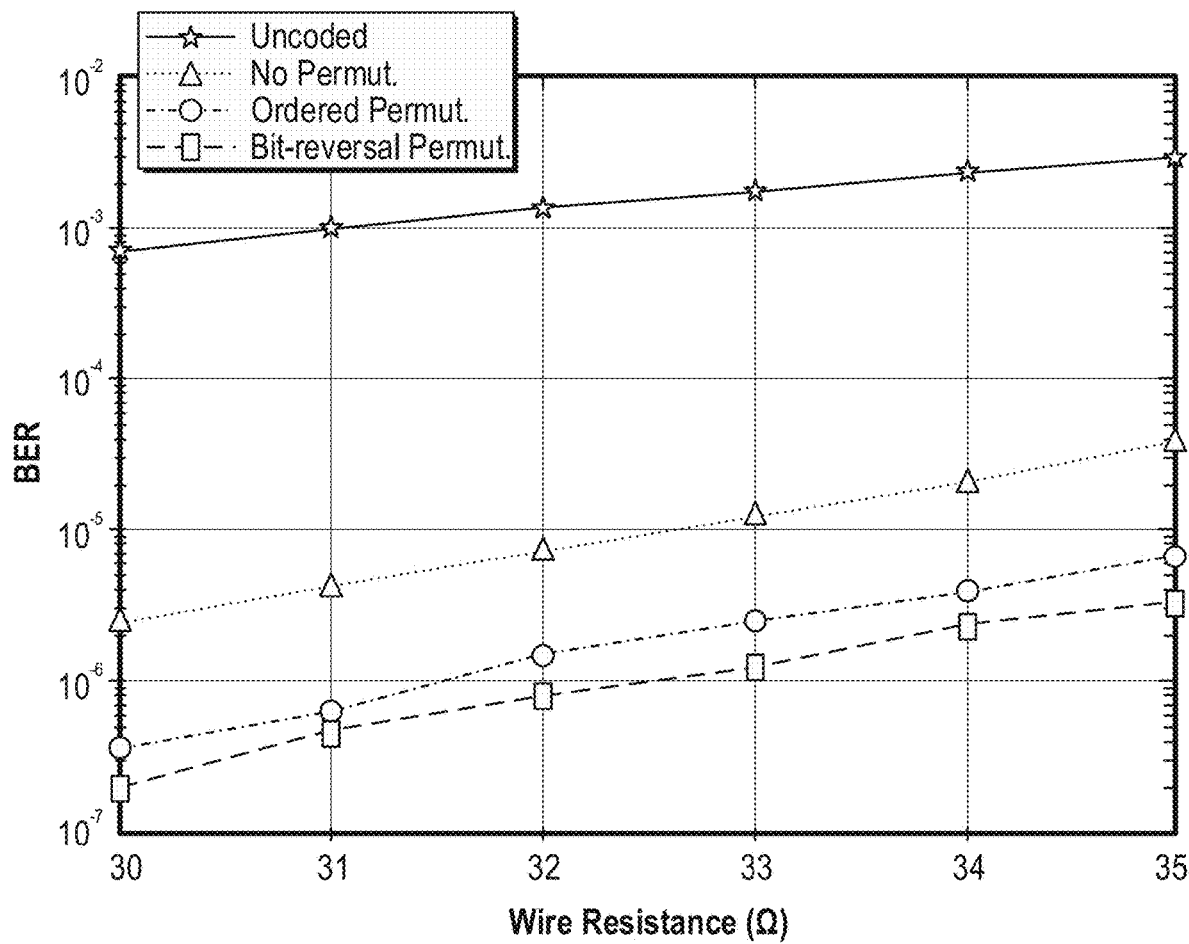
FIG. 11 illustrates an improvement in performance when using soft information in the decoding of the disclosed non-stationary polar codes according to various embodiments described herein.

FIG. 11 illustrates an improvement in performance when using soft information in the decoding of non-stationary polar codes. Instead of (or in addition to) hard decoding, one can leverage the read value at the read output and employ soft decoding. Toward that, each conditional cell distribution can be modeled as a Gaussian random variable with a certain mean and variance that we estimate empirically. Examples to construct polar codes under the Gaussian modeling include using the algorithm in Remark 1 in conjunction with the following lemma.

Lemma 8. The Bhattacharya parameter of an (asymmetric) Gaussian channel, where $W(y|0) \sim \mathcal{N}(\mu_0, \sigma_0)$, and $W(y|1) \sim \mathcal{N}(\mu_1, \sigma_1)$, is given by $Z = \int_{-\infty}^{\infty} \sqrt{W(y|0)W(y|1)}\, dy = \dfrac{\sqrt{2}\exp\left(-\dfrac{(\sigma_0 - \sigma_1)^2}{4(\sigma_0^2 + \sigma_1^2)}\right)}{\sqrt{\dfrac{\sigma_0}{\sigma_1} + \dfrac{\sigma_1}{\sigma_0}}}$

IV. Concluding Remarks

Motivated by the sneak path problem in resistive memories, this disclosure studied polar coding over channels with different reliability levels. In particular, it was argued that the channels' ordering is important and proposed a channel ordering whose attractive performance was shown numerically. The disclosed framework can be applied to the sneak path problem in resistive memories. Simulation results on SPICE-like resistive crossbar showed significant bit-error rate performance improvement, especially for low uncoded BER. Additionally, two approaches to further lower the BER were proposed. The first approach relies on a more accurate channel modeling. The second approach consists in biasing the frequency of high-resistance values in the array so as to mitigate the sneak path occurrences. One can note that while each cell was modeled individually as a BSC (or a BAC), the cost of such modeling can be amortized by using the same characterization over several crossbar arrays, which makes the model parameters costs justifiable from a practical perspective. Moreover, it is possible to cluster multiple cells together in a way to reduce the number of overall crossbar model parameters.

A. Proof of Proposition 1

Proof: Assume that $\epsilon_1 \geq \epsilon_2 \geq \epsilon_3 \geq \epsilon_4$. As for a BEC W, $Z() = 1 - I(W)$, we can equivalently study the Bhattacharya parameters. By Lemma 4, it can be checked that we need only consider three (3) different permutations.

Case 1: $\pi_1 = [0, 1, 2, 3]$: using Lemma 2, we obtain
$Z^{(0)}_{\pi_1} = \epsilon_1 + \epsilon_2 + \epsilon_3 + \epsilon_4 - \epsilon_1\epsilon_2 - \epsilon_3\epsilon_4 - (\epsilon_1 + \epsilon_2 - \epsilon_1\epsilon_2)(\epsilon_3 + \epsilon_4 - \epsilon_3\epsilon_4)$,
$Z^{(1)}_{\pi_1} = \epsilon_1\epsilon_2 + \epsilon_3\epsilon_4 - \epsilon_1\epsilon_2\epsilon_3\epsilon_4$,
$Z^{(2)}_{\pi_1} = (\epsilon_1 + \epsilon_2 - \epsilon_1\epsilon_2)(\epsilon_3 + \epsilon_4 - \epsilon_3\epsilon_4)$,
$Z^{(3)}_{\pi_1} = \epsilon_1\epsilon_2\epsilon_3\epsilon_4$.

Case 2: $\pi_2 = [0, 2, 1, 3]$: exchanging the roles of $\epsilon_1$ and $\epsilon_2$ in the previous case, we obtain $$\begin{bmatrix} Z^{(0)}_{\pi_2} \\ Z^{(1)}_{\pi_2} \\ Z^{(2)}_{\pi_2} \\ Z^{(3)}_{\pi_2} \end{bmatrix} = \begin{bmatrix} Z^{(0)}_{\pi_1} \\ \epsilon_1\epsilon_3 + \epsilon_2\epsilon_4 - \epsilon_1\epsilon_2\epsilon_3\epsilon_4 \\ (\epsilon_1 + \epsilon_3 - \epsilon_1\epsilon_3)(\epsilon_2 + \epsilon_4 - \epsilon_2\epsilon_4) \\ Z^{(3)}_{\pi_1} \end{bmatrix}.$$

Case 3: $\pi_3 = [0, 3, 1, 2]$: we obtain $$\begin{bmatrix} Z^{(0)}_{\pi_3} \\ Z^{(1)}_{\pi_3} \\ Z^{(2)}_{\pi_3} \\ Z^{(3)}_{\pi_3} \end{bmatrix} = \begin{bmatrix} Z^{(0)}_{\pi_1} \\ \epsilon_1\epsilon_4 + \epsilon_2\epsilon_3 - \epsilon_1\epsilon_2\epsilon_3\epsilon_4 \\ (\epsilon_1 + \epsilon_4 - \epsilon_1\epsilon_4)(\epsilon_2 + \epsilon_3 - \epsilon_2\epsilon_3) \\ Z^{(3)}_{\pi_1} \end{bmatrix}.$$

Analysis: Note that $$\sum_{i=0}^{3} Z^{(i)}_{\pi_1} = \sum_{i=0}^{3} Z^{(i)}_{\pi_2} = \sum_{i=0}^{3} Z^{(i)}_{\pi_3}.$$

Thus, $Z^{(1)}_{\pi_1} + Z^{(2)}_{\pi_1} = Z^{(1)}_{\pi_2} + Z^{(2)}_{\pi_2} = Z^{(1)}_{\pi_3} + Z^{(2)}_{\pi_3}$. Under $\pi_2$, it follows by Lemma 2 that $Z^{(0)}_{\pi_2} > Z^{(2)}_{\pi_2}$ and $Z^{(1)}_{\pi_2} > Z^{(3)}_{\pi_2}$. Moreover, we have $Z^{(0)}_{\pi_2} - Z^{(1)}_{\pi_2} = (1-\epsilon_1)(1-\epsilon_2)(\epsilon_3+\epsilon_4) + (\epsilon_1-\epsilon_3)(\epsilon_4-\epsilon_2) + (1-\epsilon_3)(1-\epsilon_4)(\epsilon_1+\epsilon_2) \geq 0$, $Z^{(2)}_{\pi_2} - Z^{(3)}_{\pi_2} = \epsilon_1\epsilon_3 + \epsilon_2\epsilon_4 - 2\epsilon_1\epsilon_2\epsilon_3\epsilon_4 \geq 0$.

It follows that $Z^{(3)}_{\pi_2} \leq \min(Z^{(2)}_{\pi_2}, Z^{(1)}_{\pi_2}) \leq Z^{(0)}_{\pi_2}$. Similarly, one obtains $Z^{(3)}_{\pi_1} \leq \min(Z^{(2)}_{\pi_1}, Z^{(1)}_{\pi_1}) \leq Z^{(0)}_{\pi_1}$, $Z^{(3)}_{\pi_3} \leq \min(Z^{(2)}_{\pi_3}, Z^{(1)}_{\pi_3}) \leq Z^{(0)}_{\pi_3}$.

Given the exact expressions of the Battacharaya parameters, we can determine the permutation satisfying (8), depending on the size of $\mathcal{J}$, e.g., depending on the code rate. Clearly, except for the rate ½, all permutations satisfy (8). For example, if R=¼, we choose the same best channel corresponding to $Z^{(3)}_{\pi_1}$ for all permutations. Thus, we only need to analyze the rate ½, i.e., $|\mathcal{A}|=2$. We first compare permutations $\pi_2$ and $\pi_3$.

$Z^{(1)}_{\pi_2} - Z^{(1)}_{\pi_3} = Z^{(2)}_{\pi_3} - Z^{(2)}_{\pi_2} = (\epsilon_1 - \epsilon_2)(\epsilon_3 - \epsilon_4) \geq 0$, $Z^{(1)}_{\pi_3} - Z^{(1)}_{\pi_2} = Z^{(1)}_{\pi_2} - Z^{(2)}_{\pi_3} = \epsilon_1\epsilon_2\epsilon_3 - \epsilon_3\epsilon_4 - \epsilon_1\epsilon_2 + \epsilon_1\epsilon_2\epsilon_4 + \epsilon_1\epsilon_3\epsilon_4 +$ $\epsilon_2\epsilon_3\epsilon_4 - 2\epsilon_1\epsilon_2\epsilon_3\epsilon_4 = -\epsilon_3\epsilon_4(1-\epsilon_1)(1-\epsilon_2) - \epsilon_1\epsilon_2(1-\epsilon_3)(1-\epsilon_4) \leq 0$ It follows that $Z^{(1)}_{\pi_3} \leq \min(Z^{(1)}_{\pi_2}, Z^{(2)}_{\pi_2}) \leq Z^{(2)}_{\pi_3}$. Similarly, one obtains $Z^{(1)}_{\pi_3} \leq \min(Z^{(1)}_{\pi_1}, Z^{(2)}_{\pi_1}) \leq Z^{(2)}_{\pi_3}$. Therefore $Z^{(1)}_{\pi_3}$ is the second best synthetic channel across all 3 permutations, which implies that $\pi_3$ satisfies (8).

Although embodiments have been described herein in detail, the descriptions are by way of example. The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

The term "substantially" is meant to permit deviations from the descriptive term that don't negatively impact the intended purpose. Descriptive terms are implicitly understood to be modified by the word substantially, even if the term is not explicitly modified by the word substantially.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A method, comprising:
   obtaining, by a controller, a statistical characterization analysis that ranks a plurality of channels of a nonvolatile memory based at least in part on reliabilities associated with memory cells of the nonvolatile memory;
   obtaining, by the controller, information to be stored in the nonvolatile memory;
   encoding, by the controller, the information to be stored using a linear operation on at least one vector of the information to be stored, the linear operation comprising:
   generating a polar encoded representation comprising a length-N polar code from the at least one vector of the information to be stored; and generating an output using at least one permutation that is based at least in part on: the statistical characterization analysis, and a channel dependent permutation that is applied to the polar encoded representation; and causing, by the controller, the output to be stored in the nonvolatile memory.

2. The method of claim 1, wherein the nonvolatile memory is a resistive memory comprising a resistive crossbar array.

3. The method of claim 1, wherein generating the polar encoded representation comprises applying an n-level polarization process.

4. The method of claim 1, wherein the channel dependent permutation is a composition of two permutations.

5. The method of claim 1, wherein the channel dependent permutation that is applied comprises a channel dependent permutation matrix.

6. The method of claim 1, wherein the statistical characterization analysis comprises a respective reliability level of each one of the plurality of channels; and wherein the channel dependent permutation comprises an ordered permutation that orders the plurality of channels according to their respective reliability level.

7. The method of claim 6, wherein the channel dependent permutation is a combination of the ordered permutation and a bit-reversal permutation.

8. The method of claim 1, wherein generating the polar encoded representation comprises generating a punctured polar code from the length-N polar code.

9. The method of claim 1, wherein the plurality of channels comprise binary symmetric channels (BSCs), binary asymmetric channels (BACs), or asymmetric Gaussian channels.

10. The method of claim 1, further comprising:
receiving, by the controller, stored information stored in the nonvolatile memory and encoded using the linear operation; and
decoding, by the controller, the stored information by applying a second linear operation on at least one vector of the stored information, the second linear operation comprising:
generating a second polar encoded representation by undoing the at least one permutation; and
generating a polar decoded representation using polar decoding on the second polar encoded representation.

11. The method of claim 10, wherein generating the polar decoded representation comprises applying successive cancellation decoding (SCD) for symmetric capacities of synthesized channels that tend towards 0 or 1.

12. The method of claim 10, wherein generating the polar decoded representation comprises applying soft decoding for conditional cell distribution that is modeled as a Gaussian random variable with a certain mean and variance.

13. A method, comprising:
in a controller comprising an encoder, the controller communicatively coupled to a resistive memory, performing:
generating, by the encoder, a polar encoded representation comprising a length-N polar code from at least one vector of information to be stored; and
generating, by the encoder, an output using at least one permutation that is based at least in part on: a statistical characterization analysis that ranks a plurality of channels of the resistive memory based at least in part on reliabilities associated with memory cells of the resistive memory, and a channel dependent permutation that is applied to the polar encoded representation.

14. The method of claim 13, wherein the controller is configured to obtain the statistical characterization analysis from an element or a feature associated with a computing device.

15. The method of claim 13, wherein the controller is configured to cause the output to be stored in the resistive memory.

16. The method of claim 13, wherein the channel dependent permutation is a combination of two permutations.

17. The method of claim 13, wherein the channel dependent permutation is a combination of an ordered permutation that orders the channels based at least in part on the statistical characterization analysis, and a bit-reversal permutation.

18. The method of claim 13, wherein generating the polar encoded representation comprises applying a multi-level polarization process.

19. The method of claim 13, wherein the plurality of channels comprise binary symmetric channels (BSCs), binary asymmetric channels (BACs), or asymmetric Gaussian channels.

20. The method of claim 13, wherein the statistical characterization analysis indicates a number of resistance values in the resistive memory; and wherein the encoder generating the polar encoded representation comprises biasing the number of resistance values by generating a punctured polar code based at least in part on the length-N polar code.

* * * * *